(12) United States Patent
Pakonen

(10) Patent No.: US 6,480,704 B1
(45) Date of Patent: Nov. 12, 2002

(54) METHOD AND ARRANGEMENT FOR FORMING A TRANSMISSION SIGNAL

(75) Inventor: Hannu Pakonen, Haukipudas (FI)

(73) Assignee: Nokia Mobile Phones Ltd., Espoo (FI)

( * ) Notice: Subject to any disclaimer, the term of this patent is extended or adjusted under 35 U.S.C. 154(b) by 0 days.

(21) Appl. No.: 09/427,165

(22) Filed: Oct. 26, 1999

(30) Foreign Application Priority Data

Oct. 27, 1998 (FI) .................................................. 982329

(51) Int. Cl.[7] ................................................ H03F 1/26
(52) U.S. Cl. ........................ 455/126; 455/114; 455/115; 330/129; 330/149
(58) Field of Search ................................ 330/129, 149, 330/151; 455/76, 114, 115, 126

(56) References Cited

U.S. PATENT DOCUMENTS

| | | | |
|---|---|---|---|
| 3,900,823 A | * 8/1975 | Sokal et al. | 330/149 |
| 4,600,892 A | * 7/1986 | Wagner et al. | 330/144 |
| 4,633,315 A | * 12/1986 | Kasperkovitz | 358/188 |
| 5,101,172 A | * 3/1992 | Ikeda et al. | 330/136 |
| 5,105,164 A | 4/1992 | Fisher et al. | 330/149 |
| 5,144,258 A | 9/1992 | Nakanishi et al. | 330/129 |
| 5,420,536 A | * 5/1995 | Faulkner et al. | 330/149 |
| 5,570,063 A | * 10/1996 | Eisenberg | 330/149 |
| 5,740,521 A | * 4/1998 | Hulkko et al. | 455/76 |
| 5,880,633 A | * 3/1999 | Leizerovich et al. | 330/84 |
| 6,057,735 A | * 5/2000 | Cloutier | 330/279 |
| 6,091,298 A | * 7/2000 | McNicol et al. | 330/149 |
| 6,137,999 A | * 10/2000 | Lovelace et al. | 455/302 |
| 6,236,267 B1 | * 5/2001 | Anzil | 330/149 |

* cited by examiner

*Primary Examiner*—Thanh Cong Le
*Assistant Examiner*—Stephen M. D'Agosta
(74) *Attorney, Agent, or Firm*—Perman & Green, LLP

(57) ABSTRACT

The invention relates to a method and arrangement for forming a amplitude and phase modulated transmission signal. One idea of the invention is that he modulation signal is formed of separate baseband signals controlling phase and amplitude modulation. A phase control signal (phi) is used for controlling a voltage controlled oscillator (10), from which there is further obtained a transmission frequency signal for the RF amplifier (5). By means of the amplitude control signal (A), there is controlled the amplification of the RF amplifier. From the output of the RF amplifier, there is created a feedback signal by means of a sampling circuit (6, 7), and said feedback signal is used separately for correcting both amplitude control and phase control, so that the transfer function of the arrangement is made linear. Thus the employed amplifier can be a nonlinear amplifier with a high efficiency, and yet a good phase and amplitude linearity is achieved by applying the described arrangement.

11 Claims, 3 Drawing Sheets

METHOD AND ARRANGEMENT FOR FORMING A TRANSMISSION SIGNAL

Figure 1:
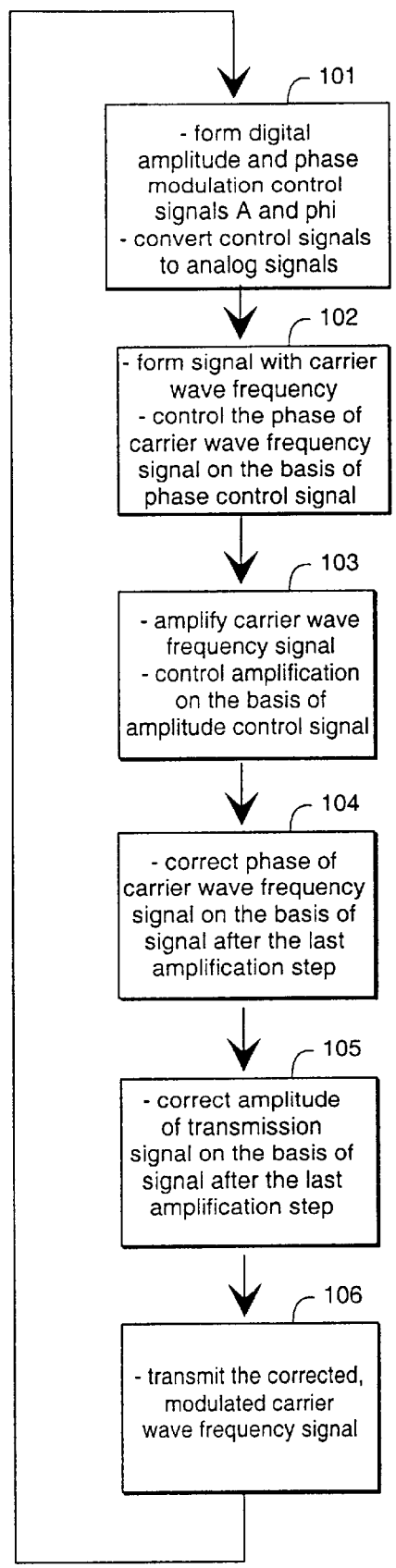

The invention relates to a method and arrangement for forming a transmission signal. The invention is advantageously applied in mobile stations, where a good linearity and low power consumption of an RF transmitter are important features.

In general, mobile station systems apply QAM (Quadrature Amplitude Modulation), where the information is modulated with the transmission signal phase and amplitude. There are also known systems where two different modulation methods are implemented. For instance the NADC (North American Digital Cellular) system applies analog NBFM (Narrow Band Frequency Modulation) and digital, combined amplitude and phase modulation OQPSK (Offset Quadrature Phase Shift Keying). In these modulation arrangements it is important that both the amplitude and phase of the signal to be transmitted are transferred through the transmission chain in a linear fashion.

In order to achieve good linearity, the transmitters generally use power amplifiers of classes A and AB. The transistors of these amplifiers are kept continuously in the linear range by means of biasing. A drawback in these arrangements, in particular with reference to mobile stations, is the high power consumption of the amplifiers, i.e. poor efficiency, which is caused by high idle current consumption. Low power consumption of the amplifier is an important feature in mobile stations, because said devices are usually operated with small-size batteries.

In order to cut power consumption, it is possible to use amplifiers of classes B, C, D, E and F. In amplifiers of these classes, the transistors in idle state are nearly or completely without bias voltage, wherefore their idle current consumption is very low. However, a drawback with the amplifiers of said classes is their nonlinearity.

In the prior art there is known, from the U.S. Pat. Nos. 5,144,258 and 5,105,164 a power amplifier arrangement whereby the linearity of a nonlinear amplifier is improved by comparing the amplitudes of incoming and outgoing signals, and the gain of a nonlinear amplifier is controlled on the basis of said comparison. Thus it is attempted to control the amplifier output in proportion to the control voltage amplitude by means of feedback. The drawback of this solution, however, is that although the absolute value of the output amplitude would be made linear in relation to the absolute value of the control signal amplitude, the output signal phase still behaves in a nonlinear fashion with respect to the control signal phase.

From the patent publication U.S. Pat. No. 5,740,521, there is known an arrangement for forming transmission signal, wherein by means of a phase-locked loop, it is attempted to correct the error occurring in the frequency of an intermediate-frequency oscillator. However, the suggested procedure does not correct the phase error possibly caused by a nonlinear amplifier.

The object of the invention is to eliminate the above mentioned drawbacks by introducing a novel arrangement, where the nonlinearity of the power amplifier is corrected by means of both phase and amplitude feedback. Now the employed amplifier can be a nonlinear amplifier with a high efficiency, and yet a good phase and amplitude linearity is achieved by means of the arrangement.

One idea of the invention is that the modulation signal is formed of separate baseband signals controlling the phase and amplitude modulation. A phase control signal controls a phase-locked loop, wherefrom there is further obtained a transmission frequency signal to the nonlinear RF amplifier. An amplitude control signal controls the amplification of the RF amplifier. The signal obtained from the RF amplifier output is used as the feedback signal, for separately correcting both the amplitude control and the phase control, so that the transfer function of the arrangement is made linear as regards both amplitude and phase.

In the specification of the invention and in the appended claims, "phase modulation" may also mean frequency modulation, unless informed to the contrary.

The method according to the invention for forming an amplitude and phase modulated transmission signal, wherein there are created a baseband amplitude modulation signal and a phase modulation signal, there is formed a carrier frequency signal, the phase of said carrier frequency signal is controlled on the basis of said phase modulation signal, the carrier frequency signal is amplified in order to form a transmission signal, and the amplification of said carrier frequency signal is controlled on the basis of said amplitude modulation signal, is characterised in that in addition to the above, the phase of the carrier frequency signal also is controlled on the basis of the carrier frequency signal received after the last amplification step in order to correct the transmission signal phase, and the absolute value of said amplification is controlled on the basis of the carrier frequency signal received after the last amplification step in order to correct the amplitude of the transmission signal.

The arrangement according to the invention for forming an amplitude and phase modulated transmission signal, comprising means for forming a baseband amplitude modulation signal and a phase modulation signal, an oscillator for creating a carrier frequency signal, means for controlling the phase of the oscillator output signal on the basis of the phase modulation signal, an amplifier for amplifying the carrier frequency signal and for forming a transmission signal, as well as means for controlling the amplification of said amplifier on the basis of said amplitude modulation signal, is characterised in that the arrangement also comprises means for controlling the phase of the output signal of said oscillator on the basis of the output signal of substantially the last amplification step of said amplifier in order to correct the transmission signal phase, and means for controlling the amplification of said amplifier on the basis of the output signal of substantially the last amplification step in order to correct the transmission signal amplitude.

Preferred embodiments of the invention are presented in the dependent claims.

Figure 2:
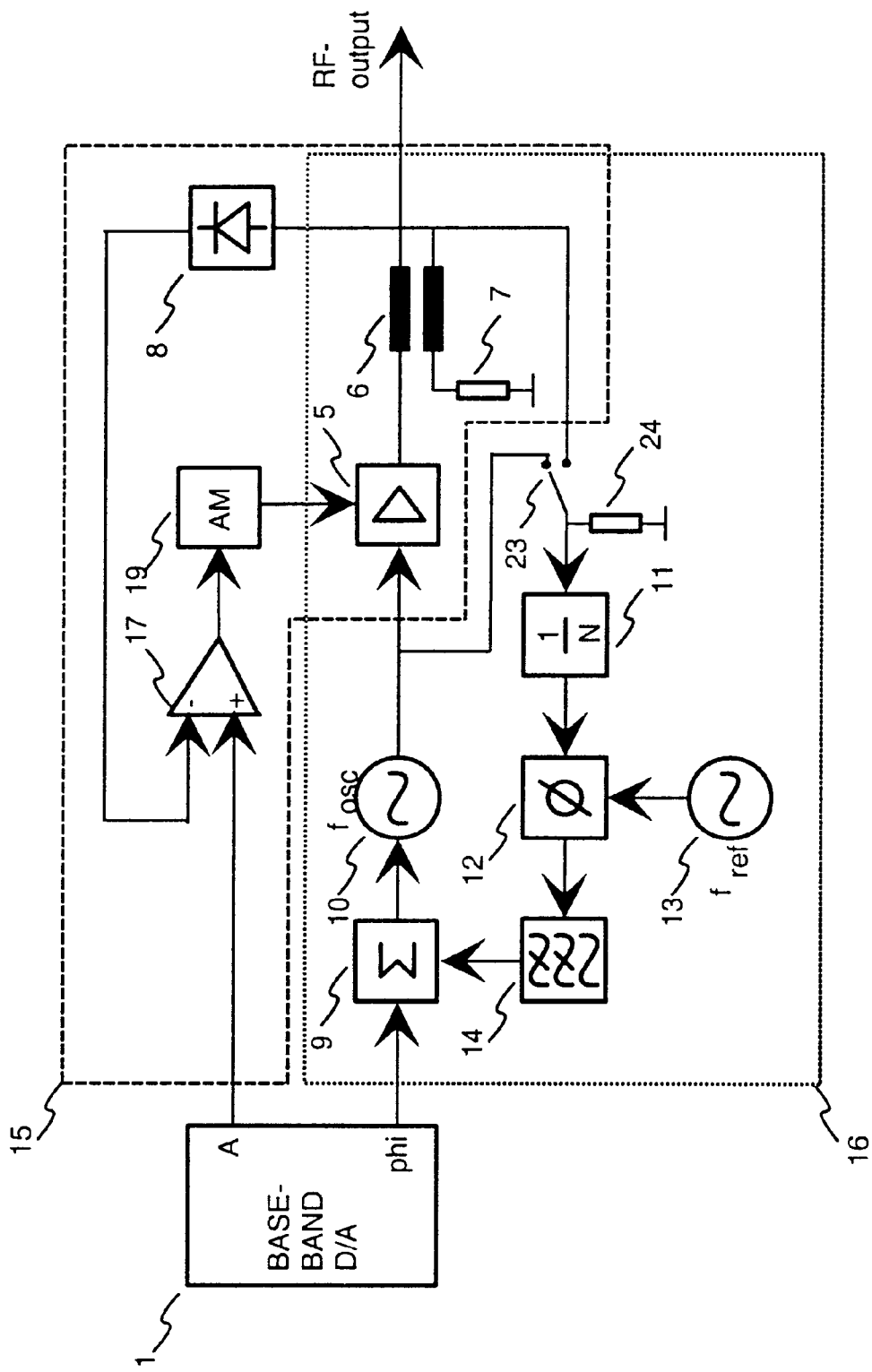
Figure 3:
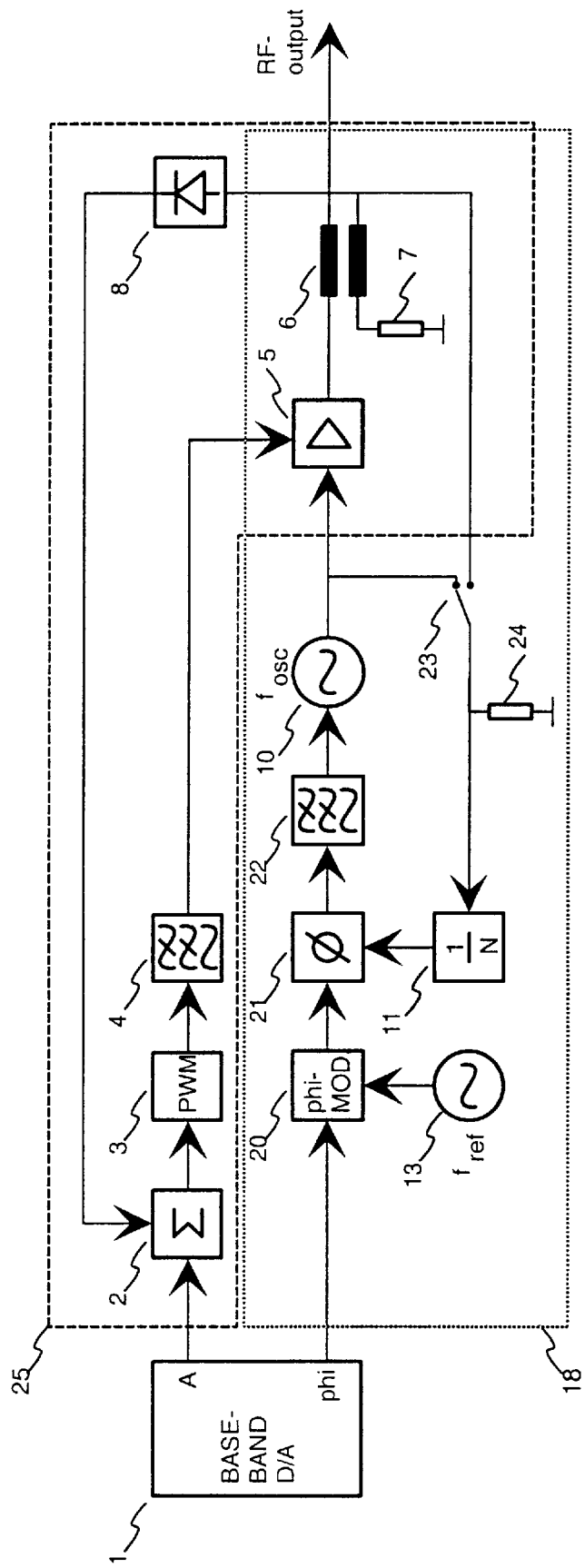

In the following specification, the invention is explained in more detail with reference to the appended drawing, where FIG. 1 is a flow diagram of a method according to the invention for forming a transmission signal, FIG. 2 is a block diagram of an arrangement according to the invention for forming a transmission signal, and FIG. 3 is a block diagram illustrating another arrangement according to the invention for forming a transmission signal.

FIG. 1 illustrates a method according to the invention for forming a transmission signal. In step 101, there are formed, on the basis of the information to be transmitted, baseband, preliminary amplitude modulation signal A and phase modulation signal phi. Advantageously said signals are formed by means of digital calculations, whereafter the obtained digital signals are converted to analog signals. The control signals A and phi are obtained from the components I and Q of the complex modulation signal as follows:

$$A = \sqrt{I^2 + Q^2} \tag{1}$$

$$phi = \arctan\left(\frac{Q}{I}\right) \tag{2}$$

In step 102, there is formed a carrier frequency signal, the phase whereof is controlled on the basis of a preliminary phase modulation signal. Thereafter, in step 103, there is amplified a carrier frequency, phase modulation signal in order to create the transmission signal. The amplification of the carrier frequency signal is controlled on the basis of the preliminary amplitude modulation signal, so that amplitude modulation is obtained in the transmission signal.

In step 104, the phase of the carrier frequency signal also is controlled on the basis of the carrier frequency signal obtained after the last amplification step in order to correct the transmission signal phase. Most advantageously the control is carried out by comparing the phases of the output signal with lowered frequency and the preliminary phase modulation signal, and by forming the final phase modulation signal on the basis of said comparison.

In step 105, the absolute value of the amplification of a carrier frequency signal also is controlled on the basis of the carrier frequency signal after the last amplification step in order to correct the transmission signal amplitude. This control is most advantageously realised by comparing the level of the attenuated and rectified output signal with the preliminary level of the modulation signal, and by forming the final amplitude modulation signal on the basis of the comparison result.

Finally, in step 106, the transmission signal with corrected amplitude and phase is transferred to the data transmission channel.

FIG. 2 illustrates a block diagram of an arrangement according to the invention for forming the transmission signal. This arrangement comprises a unit 1 for forming the modulation control signals.

First, the information signal is rendered, by applying DSP (Digital Signal Processing) to the I and Q values of a complex baseband information signal, into the A of the amplitude modulation control signal and to the phi of the phase/frequency modulation control signal. Thus the control signal A describes the amplitude of the signal, and the phi describes its frequency and phase. These control signals obtained from the digital signal processor are converted to analog form in a D/A converter.

Let us first observe how the frequency and/or phase modulation is formed in the transmission signal. The control signal phi is fed, via the summing unit 9, to a voltage controlled oscillator 10, and the carrier frequency signal formed by said oscillator 10 is then fed to an RF amplifier 5. In the output of the RF amplifier 5, there is coupled a direction switch 6 in order to take an attenuated sample signal from the output signal of the RF amplifier. This directional switch comprises two adjacent transfer lines having the length of a quarter wave. The sample extracted from the output signal of the RF amplifier is coupled, via a frequency divider 11, to a phase comparator 12, where its phase is compared with the reference frequency $f_{ref}$ 13 obtained from the reference oscillator. The result from this comparison is fed, via a low-pass filter 14, to the summing unit 9 in order to create the feedback and to form the phase-locked loop. Thus the phase-locked loop tends to control the voltage controlled oscillator, so that the phase difference of the output signal of the RF amplifier and the reference signal remains constant. However, the correction response of the phase-locked loop is, by means of the filter 14, set so slow that it does not affect the phase modulation caused by the phase modulation signal phi. The RF amplifier thus constitutes a part of the phase-locked loop, and thus the phase nonlinearity of the amplifier is corrected. However, by means of the switch 23, it is still possible to remove the RF amplifier from the phase-locked loop for the duration of the power increase, in order to keep the phase-locked loop in locked state. In that case the oscillator is coupled, for the duration of the power increase, to the load 24, so that a better adaptation also is achieved for said period. The components affecting the frequency/phase modulation are in FIG. 2 outlined with a dotted line 16.

Let us further observe how the amplitude modulation is formed in the transmission signal. The amplitude control signal A is conducted, via the summing unit 2, to the positive input of the comparator 17, and said comparator further controls the amplitude modulator 19. To the negative input of the comparator 17, there is conducted an attenuated and rectified sample obtained from the output signal of the RF amplifier. Thus the amplitude modulator 19 tends to control the amplification of the RF amplifier 5, so that the amplitude modulation control signal A and the attenuated and rectified sample obtained from the output of the RF amplifier are equal in level. Thus the feedback attempts to correct the nonlinearity of the amplitude amplification of the RF amplifier. In FIG. 2, the components affecting to the amplitude modulation are outlined with a dotted line 15.

FIG. 3 illustrates a block diagram of another arrangement according to the invention for forming a transmission signal. Also here, the modulation control signals are formed in a unit 1, where on the basis of the information to be modulated in the transmission signal, in the processor there are first created digital amplitude and phase control signals, of which the DIA (Digital/Analog) converter further forms the analog control signals A and phi.

In principle, the modulation of the amplitude is carried out in similar fashion as was already explained with reference to FIG. 2. However, the control of the amplitude modulation is realised by using a pulse width modulator 3, from which there is obtained the amplification control voltage of the RF amplifier by filtering the pulse sequence of the pulse width modulator in a low-pass filter 4. In order to stabilise the feedback loop of the RF amplifier amplification, the amplitude control signal A and the feedback signal conducted from the RF amplifier output are coupled, instead of the comparator, to the summing unit 2. The components affecting the amplitude modulation are outlined with a dotted line 25.

Let us further observe how the frequency and phase modulation are carried out in the arrangement illustrated in FIG. 3. The signal phi is fed, via an integrator 19, to a phase modulator 20, which employs as its reference frequency the output of the oscillator $f_{ref}$ 13. The signal is further conducted, via the frequency comparator 21 and a low-pass filter 22, to a frequency-controlled oscillator 10, and the carrier frequency signal created by said oscillator is fed to an amplifier 5. From the amplifier output, there is extracted a sample signal which is fed, via a frequency divider 11, to a phase comparator 21, where the phase of the signal obtained from the phase modulator 20 is compared with the phase of the sample signal with a divided frequency. Thus the phase-locked loop tends to control the voltage controlled oscillator, so that the phase of the output signal of the RF amplifier remains correct in relation to the phase of the reference signal and the phase control. Now the RF amplifier constitutes a part of the phase-locked loop, and thus the phase nonlinearity of the amplifier is corrected. However, by means of the switch 23, it is still possible to remove the RF amplifier from the phase-locked loop for the duration of the power increase, in order to keep the phase-locked loop in locked state. In that case the oscillator is coupled, for the duration of the power increase, to the load 24, so that a better matching also is achieved for the duration of the power increase. In FIG. 3, the components affecting the frequency/phase modulation are outlined with a dotted line 18.

Let us next observe, by way of example, how the arrangement according to the invention is implemented in a dual mode phone of the NADC (North American Digital Cellular) system. In a telephone according to said system, there are used two modulation methods: the analog NBFM method and the digital OQPSK method. When implementing the arrangement according to the invention, both transmission modes use the same signal path. In the OQPSK phase modulation, there is used both the amplitude control signal A and the phase control signal phi for modulating carrier frequency signals. When using the NBFM frequency modulated transmission mode, the amplitude of the signal is kept constant, so that the control signal A is only used for switching the transmission.

Thus the arrangement uses, in the digital operation mode, phase modulation OQPSK, in which case amplitude is modulated with the signal A, and phase is modulated by controlling the voltage controlled oscillator with the signal phi. In the analog operation mode, the NBFM frequency modulation is carried out so that in this case the signal A has a constant amplitude, and the signal phi describes the modulating audio signal and is fed into an FM modulator or directly to the voltage controlled oscillator.

The invention is not restricted to the above described preferred embodiments only, but many modifications are possible within the scope of the inventive idea defined in the appended claims. In particular, the invention can be used in connection with other modulation modes, amplifier types and data transmission systems.

What is claimed is:

1. A method for forming an amplitude and phase modulated transmission signal, wherein
   there are formed baseband amplitude modulation signal (A) and phase modulation signal (phi)(101),
   there is formed a carrier frequency signal (102),
   the phase of said carrier frequency signal is controlled on the basis of said phase modulation signal (102),
   the carrier frequency signal is amplified in order to form a transmission signal (103), and
   the amplification of said carrier frequency signal is controlled on the basis of said amplitude modulation signal (103),
characterised in that in addition,
   the phase of the carrier frequency signal also is controlled on the basis of the carrier frequency signal after the last amplification step in order to correct the transmission signal phase (104), and
   the absolute value of said amplification is controlled on the basis of the carrier frequency signal after the last amplification step in order to correct the transmission signal amplitude (105).

2. A method according to claim 1, characterised in that the step where the phase of the carrier frequency signal is controlled on the basis of the carrier frequency signal after the last amplification step (104), further comprises steps where
   a reference signal is created,
   the frequency of the signal after the last amplification step is divided in order to correspond to the frequency of the reference signal,
   the phases of the reference signal and the frequency divided signal are compared, and there is formed a first reference signal which is proportional to the result of the performed comparison, and
   the frequency of the carrier frequency signal is controlled on the basis of said first reference signal.

3. A method according to claim 2, characterised in that the preliminary control signal (phi) of the phase modulation is summed to the first reference signal, and the frequency of the carrier frequency signal is controlled on the basis of the sum signal.

4. A method according to claim 1, characterised in that the step, where the phase of the carrier frequency signal is controlled on the basis of the baseband signal after the last amplification step (104), further comprises phases where
   a reference signal is formed,
   the frequency of the signal after the last amplification step is divided in order to correspond to the frequency of the reference signal,
   there is formed a phase modulation signal on the basis of the reference signal and the preliminary phase control signal (phi), and
   the phases of the phase modulation signal and said frequency divided signal are compared, and there is formed a second reference signal proportional to the result of the performed comparison, and
   the frequency of the carrier frequency signal is controlled on the basis of said second reference signal.

5. An arrangement for forming an amplitude and phase modulated transmission signal, comprising
   means (1) for forming a baseband amplitude modulation signal (A) and a phase modulation signal (phi),
   an oscillator (10) for creating a carrier frequency signal,
   means for controlling the phase of the output signal on the basis of the phase modulation signal (9, 20, 21, 22),
   an amplifier (5) for amplifying the carrier frequency signal and for creating a transmission signal, as well as
   means (3, 4, 19) for controlling the amplification of said amplifier (5) on the basis of said amplitude modulation signal,
characterised in that said arrangement also comprises
   means (6, 7, 9, 11–14, 21) for controlling the phase of the output signal of said oscillator on the basis of the output signal of the substantially last amplification step of said amplifier in order to correct the phase of the transmission signal, and
   means (2, 6–8, 17) for controlling the amplification of said amplifier on the basis of the output signal of the substantially last amplification step in order to correct the transmission signal amplitude.

6. An arrangement according to claim 5, characterised in that said means for correcting the amplifier output signal comprise
   means (6, 8) for forming a first feedback signal proportional to the amplifier output, means (2, 3, 4, 17, 19) for controlling the amplifier amplification on the basis of the first feedback signal and the preliminary amplitude control signal (A).

7. An arrangement according to claim 5, characterised in that said means for controlling the phase of the oscillator output signal on the basis of the output signal of the substantially last amplification step of said amplifier comprise means (6) for creating a second feedback signal proportional to the amplifier output,
  a frequency divider (11) for reducing the frequency of the second feedback signal,
  a reference oscillator (13) for creating a reference frequency signal,
  a phase comparator (12, 21) for forming a control signal to said oscillator on the basis of of the phases of the frequency divided second feedback signal and the reference signal, and
  a low-pass filter (14, 22) for setting the feedback response.

8. An arrangement according to claim 7, characterised in that it comprises means (23) for creating a second feedback signal of the amplifier input signal during a power increase.

9. An arrangement according to claim 6, characterised in that said first feedback signal and second feedback signal are formed of one and the same signal.

10. An arrangement according to claim 5, characterised in that it belongs to the transmission part of a mobile station.

11. An arrangement according to claim 10, characterised in that said mobile station comprises means for connecting in the NADC cellular system.

* * * * *